United States Patent [19]

Matsunaga et al.

[11] Patent Number: 4,789,846

[45] Date of Patent: Dec. 6, 1988

[54] MICROWAVE SEMICONDUCTOR SWITCH

[75] Inventors: Makoto Matsunaga; Yoshitada Iyama; Fumio Takeda, all of Kanagawa, Japan

[73] Assignee: Mitsubishi Denki Kabushiki Kaisha, Tokyo, Japan

[21] Appl. No.: 45,627

[22] Filed: May 1, 1987

[30] Foreign Application Priority Data

Nov. 28, 1986 [JP] Japan .................... 61-183456[U]
Feb. 12, 1987 [JP] Japan .................... 62-30105

[51] Int. Cl.$^4$ ............................................ H01P 1/15
[52] U.S. Cl. .................................... 333/104; 333/247
[58] Field of Search ................ 333/101, 103, 104; 307/243, 244, 571

[56] References Cited

U.S. PATENT DOCUMENTS 3,178,659 4/1965 Smith et al. .................... 333/103
3,452,299 6/1969 Angel .............................. 333/103
4,556,808 12/1985 Coats ............................... 307/571

FOREIGN PATENT DOCUMENTS 101501 6/1983 Japan ............................... 333/104

OTHER PUBLICATIONS

*Resonated GaAs FET Devices for Microwave Switching*, McLevige et al., IEEE Trans. on ED, vol. ED-28, No. 2, Feb. 1981, pp. 198-204.
*An X-Band 10W Monolithic Transmit-Receive GaAs FET Switch*, Ayasli et al., IEEE Trans. on ED, CH1784-8/82, pp. 42-46.

*Primary Examiner*—Paul Gensler
*Attorney, Agent, or Firm*—Wolf, Greenfield & Sacks

[57] ABSTRACT

A microwave semiconductor switch wherein first and second field effect transistors and first, second and third input/output microstrip lines are integrally formed on a semiconductor substrate. The first field effect transistor is connected in series between the second input/output line and a junction point of the first, second and third input/output lines at a position adjacent to the junction point. The second field effect transistor is connected at a second position spaced approximately a quarter of the wavelength from the junction point between the second position and the ground. The drain electrodes and source electrodes of the first and second transistors are placed at the same potential. The transmission paths for microwaves are switched by varying a bias voltage applied to the gate electrodes of the field effect transistors.

9 Claims, 5 Drawing Sheets

MICROWAVE SEMICONDUCTOR SWITCH

BACKGROUND OF THE INVENTION

1. Field of the Invention

The present invention relates to a microwave semiconductor switch adapted to switch the transmission path for microwaves depending on whether the power of the applied electric wave is large or small.

2. Description of the Prior Art

FIGS. 1(a) and 1(b) are plan and side elevation, respectively, that show the constitution of a microwave semiconductor switch which is shown in "IEEE Transactions on ED", Vol. ED-28, No. 2, February 1981 "Resonated GaAs FET Devices for Microwave Switching". In the drawing, numeral 1 designates a semiconductor substrate, numeral 2 designates the first microstrip line (microstrip lines are hereinafter referred to simply as lines), numeral 3 designates the second line, numeral 4 designates the third line, numerals 5 and 6 designate respective inductor lines, numerals 7 and 8 designate gate bias lines and numeral 9 designates the ground plate. The ground plate 9 is constituted by metalizing a conductor at the rear surface of semiconductor substrate 1. The first, second and third lines have an electrostatic capacity distributed relative to the ground plate 9. The microwave voltage propagates along said lines as the voltage between the lines and the ground plate.

Numeral 10 designates the first field effect transistor (herinafter abbreviated to FET), numeral 11 designates the drain electrode of FET 10, numeral 12 designates the source electrode of FET 10, numeral 13 designates the gate electrode of FET 10, numeral 14 designates the second FET, numeral 15 designates the drain electrode of FET 14, numeral 16 designates the source electrode of FET 14 and numeral 17 designates the gate electrode of FET 14.

One end of the first line 2 is connected to the input-/output terminal and the other end is bifurcated. The two branches are respectively connected to the source electrodes 12, 16 of the first and second FETs. It is further to be noted that the drain electrode 11 of the first FET 10 is connected to the second line 3 and that the drain electrode 15 of the second FET 14 is connected to the third line 4. The bias voltage is applied to the gate electrode 13 of the first FET 10 and the gate electrode 17 of the second FET through the gate bias lines 7, 8 respectively. The source electrodes and the drain electrodes of the first FET 10 and the second FET 14 are at the same potential with respect to D.C. bias and the high impedance line 18 having the tip end connected to the ground plate 9 is connected to the main lines so as to make the potential of the main lines the same as that of the ground plate 9.

Referring to FIG. 2 showing an equivalent circuit having the connections shown in FIG. 1, the same numerals as those employed in FIGS, 1(a) and 1(b) designate similar portions.

Operation of the microwave semiconductor switch shown in FIGS. 1(a) and 1(b) will next be explained. The potential at the ground plate 9 (i.e. voltage is zero) is applied to the gate electrode 13 and the gate electrode 17 has the bias voltage $V_{BIAS}(|V_{BIAS}| > |V_p|)$ which is lower than the pinch-off voltage $V_p$ applied to it. Low impedance R is caused relative to the microwave voltage between the source electrode 12 and the drain electrode 11, and the connection between the source electrode 16 and the drain electrode 15 is cut off so that a capacitive impedance $JX_2$ is caused relative to the microwave. This impedance $JX_2$ is connected in parallel with the impedance caused by the inductance line 6 and parallelly-resonated relative to the microwave frequency so that a high impedance is provided. Accordingly, the first line 2 and second line 3 is connected relative to the microwave but the connection between the first line 2 and the third line 4 is cut off.

Similarly, if the potential of zero V is applied to the gate electrode 17 and $V_{BIAS}$ to the gate electrode 13, the first line 2 and the third line 4 are connected but the connection between the first line 2 and the second line 3 is cut off.

Since a microwave semiconductor switch according to the prior art is so constituted, the breakdown voltage of field effect transistors will become problematical. For example, assuming that the characteristic impedance of the respective microstrip lines is Z, and that the input power is P, FET 14 being cut-off and the input power P being transmitted from the first line 2 to the second line 3 withuut generating any standing wave, the effective value Ve of the voltage between the first line and the ground plate 9 is $Ve=\sqrt{PZ}$ which will become the voltage at the source electrode 16. The maximum value of this voltage is 1.4 Ve. On the other hand, since the gate electrode 17 is applied with $V_{BIAS}$, the maximum voltage as applied between the gate electrode and the source electrode is $$1.4 \frac{Ve}{2} - V_{BIAS},$$

which is 13.6 V if it is assumed, for example, that $V_{BIAS} = -5$ V, $Z = 50 \, \Omega$, and $P = 3$ W. It is not easy, however, to obtain a high breakdown voltage of more than 13.6 V between the gate electrode and the source electrode in FETs intended to serve as switches having a low loss and a small resistance $R_1$ between the drain electrode and the source electrode under the ON state while keeping the gate bias voltage at zero V. The production efficiency of FETs having high breakdown voltage characteristics is therefore poor so that very expensive microwave semiconductor switches may result.

FIGS. 3(a) and 3(b) are a plane view and side elevation respectively illustrating another example of the construction of microwave semiconductor switches as presented in the technical papers reported at the Symposium "IEEE 1982 Microwave and Millimeter-Wave Monolithic Circuits Symposium" held in U.S.A. in June, 1982.

In FIG. 3(a), numeral 19 designates the second input-/output line, numeral 20 designates the third input/output line, numeral 21 designates a low impedance line having a length equivalent to one half of the wave length, and numeral 22 designates a high impedance line having a length equivalent to one half of the wave length. These microstrip lines are formed on the semiconductor substrate 1 (shown in FIG. 3(b)).

Numeral 23 designates the first field effect transistor (hereinafter abbreviated as the first FET), numeral 24 designates the drain electrode of the first FET, numeral 25 designates the source electrode of the first FET, and numeral 26 designates the gate electrode of the first FET. The source electrode 25 of the second FET is connected to the ground plate 9 through golden wires 27 or the like, and the drain electrode 24 of the first FET is connected to the low impedance line 21.

Numeral 28 designates the second field effect transistor (hereinafter abbreviated as the second FET), numeral 29 designates the drain electrode of the second FET, numeral 30 designates the source electrode of the second FET and numeral 31 designates the gate electrode of the second FET. The source electrode 30 of the second FET is connected to the ground plate 9 through golden wires 27 or the like and the drain electrode 29 of the second FET is connected to the high impedance line 22.

A bias voltage is applied to the gate electrode 26 of the first FET 23 from the first bias terminal 33 through the bias circuit 32 comprising microstrip line. Similarly, a bias voltage is applied to the gate electrode 31 of the second FET 28 from the second bias terminal 34 through the bias circuit 32.

The point where the first input/output line 2, the low impedance line 21 and the high impedance line 22 are connected to each other is termed the junction point 35. Then the drain electrodes of the first FET 23 and the second FET 28 are connected at a point on the low impedance line 21 and high impedance line 22 that is spaced one quarter of the wave length from the junction point 35, respectively In order that the source electrodes and the drain electrodes of both FETs be placed at the same potential, the high impedance ground line 36 is connected from the ground plate 9 to the first input/output line 2. High impedance ground line 36 therefore causes the input/output line 2 to be grounded with respect to D.C. current. However, because line 36 presents a high impedance to microwave signals in the normal operating range, it does not ground input/output line 2 with respect to such microwave signals.

Operation of the switch will next be explained.

FIG. 4 illustrates a circuit equivalent to that shown in FIGS. 3(a) and 3(b) for explanation of the operation of the microwave semiconductor switch shown in FIGS. 3(a) and 3(b). In this equivalent circuit diagram, the bias circuit 32 and the high impedance ground line 36 are omitted for the sake of simplicity.

Explanation on the operation of the switch with reference to FIG. 4 proceeds firstly with the case where a low power microwave has been provided from the first input/output line 2 and then with the case where a high power microwave with a power on the order of several watts has been provided.

Firstly, it is assumed that the low power microwave has been supplied from the first input/output line 2 and propagates to the third input/output line 20.

At this time, a negative bias voltage $V_{BIAS}$ ($|V_{BIAS}| > |V_p|$) smaller than the pinch-off voltage $V_p$ is applied t.o the second bias terminal 34 and the second FET 28 provides a high impedance. At the same time, the first bias terminal 33 is placed at zero V and the first FET 23 provides a low impedance, which is referred to as $R_1$. Since this impedance $R_1$ is sufficiently smaller than the characteristic impedance $Z_1$ of the low impedance line 21, the impedance as viewed from the junction point 35 to the second input/output line 19 shows as high impedance as an almost fully opened condition. Accordingly, the microwave provided from the first input/output line 2 propagates along the high impedance line 22 and appears at the third input/output line 20. At this instance since the second FET 28 provides a high impedance, the microwave being propagated will not be affected Next, consideration is given to the case in which a high power microwave is provided from the first input/output line 2 and the microwave is supplied to the second input/output line 19. In this case, the conditions of the bias applied to FETs is assumed to be as follows The second bias terminal 34 is placed at zero V and a negative bias voltage $V_{BIAS}$ ($|V_{BIAS}| > |V_p|$) smaller than the pinch-off voltage $V_p$ is applied to the first bias terminal 32. Under this biasing condition, the second FET 28 provides a low impedance $R_2$ and the first FET 23 provides a high impedance. Consequently, the impedance as viewed from the junction point 35 to the third input/output lines 20 shows as high impedance as an almost fully opened condition and the microwave provided from the first input/output line propagates along the low impedance line 21 and appears at the second input/output line 19.

It is to be noted here that the first FET 23 provides a high impedance and will not affect the microwaves propagating along the low impedance line 21 having the characteristic impedance $Z_1$.

In the switch under such biasing conditions, since the high power microwave propagates, the RF current which flows through the second FET 28 and the RF voltage applied to the first FET 23 both have large values. It is therefore necessary to use FETs capable of standing these large values.

If a microwave having a power of P watt is assumed to have been input, RF Peak current I which flows through the second FET 28 may be expressed by the following equation:

$$I = \frac{2Z_2 \sqrt{2Z_0 P}}{R_2 Z_0 + 2Z_2^2}$$

where $R_2$ is the resistance of the second FET 28 biased at zero V and $Z_2$ is the characteristic impedance of the high impedance line 22.

In the meantime( RF Peak voltage V which is applied to the first FET 23 may be expressed by the following equation:

$$V = \frac{Z_1}{Z_0} \sqrt{2Z_0 P}$$

where $Z_1$ is the characteristic impedance of the low impedance line 21.

For example, assuming that the input/output power is equal to 5 W, $Z_0 = 50 \Omega$, $R_2 = 3 \Omega$ and that $Z_2$ is equal to 75 $\Omega$, $Z_1$ being equal to 40 $\Omega$, the value of the current is 0.23 A and the value of the voltage V is 14 V. As far as the current value of 0.23 A is concerned, this value will be a drain current which can be caused to flow by FETs having a normal gate width of 1 mm and there is not problem. However, with regard to the voltage, the value 14 V is one which may possibly exceed the permissible value for FETs. In other words, if the gate bias voltage of the first FET 23 is assumed to be $V_{BIAS}$, the pinch-off voltage being assumed to be $V_p$ and the break-down voltage at the gate being assumed to be $V_{BR}$, the following relationships have to be established:

$$|V_{BR}| \geq V + |V_p|$$

$$|V_{BIAS}| = \tfrac{1}{2}V + |V_p|$$

If the absolute value of the pinch-off voltage $|V_p|$ is assumed to be equal to 2 V, 16 V is required for the breakdown voltage $|V_{BR}|$ and 9 V is required for the bias voltage $|V_{BIAS}|$. This breakdown voltage of 16 V cannot be so easily obtained by the sort of FETs which are designed for mass-production, and it is also difficult to make the allowable input power to microwave semiconductor switches of this sort to be on the order of 3 W.

Moreover, in order to reduce the voltage applied to the FETs, the electrical length of the low impedance line 21 should be chosen to be equal to one half of the wave length, which causes the area of the semiconductor substrate 1 constituting this microwave semiconductor switch to be increased.

Since the microwave semiconductor switch shown in FIGS. 3(a) and 3(b) is constructed in the manner explained above, in order to enable an increase in the permissible input power to a level of several watts, a production method involving special steps for manufacturing FETs which are highly resistant against high voltages has to be employed, and this has resulted in such problems as reduction in production efficiency and unsuitability for mass-production. At the same time, since a low impedance line having a length equivalent to one half of the wave length is employed which does not permit high voltages to be applied to the FETs, the dimensions of the semiconductor substrate have to be increased.

SUMMARY OF THE INVENTION

It is a general object of the present invention to solve the problems mentioned above.

It is a first object of the present invention to obtain a microwave semiconductor switch that enables switching of the paths by means of FETs having a low resistance against voltage in a case where the direction of the microstrip lines along which a relatively high power microwave propagates is limited.

To accomplish this object, the FETs of the first embodiment according to the present invention are cut off when cutting off a relatively high power microwave but the microstrip line is not cut off. The microstrip line is short-circuited by means of the FET at a point spaced one quarter of the wave length from the point at which the microstrip line has to be cut off.

In a distributed constant circuit such as a microstrip line, if a point on the line is short-circuited, the impedance at a point spaced one quarter of the wave length from the short-circuited point becomes high. Therefore, short-circuiting of the line by means of a FET results in the same effect as cutting off the line and it is possible to provide a design that will serve to control all the FETs to remain in the ON state in the switching condition in which a relatively high power is transmitted.

Accordingly, it is possible to reduce the microwave voltage applied between the drain electrodes and the source electrodes of the FETs in a circuit where the direction of the microstrip line which transmits a relatively high power is limited to one direction, as in the case of switching a microwave antenna between the transmission and reception modes. Thus, no problem arises as to the resistance against voltage between the electrodes of the FETs and the production efficiency in manufacturing microwave semiconductor switches is improved.

It is a second object of the present invention to provide a microwave semiconductor switch having a large handling power and adapted to switch the transmission paths of a microwave.

To accomplish this object, the microwave semiconductor switch of a second embodiment according to the present invention is so constituted that one FET is connected in series to one of the input/output lines adjacent the junction point of three input/output lines, and the other FET is connected in parallel with the other input/output line at a position spaced one quarter of the wave length from the junction point.

In the microwave semiconductor switch according to the second embodiment, when a microwave with a power of several watts is supplied, the FET connected in series with the input/output line which serves as the output side and the FET connected in parallel with the input/output line which is to be cut off are both placed in a low impedance state. Accordingly, any RF voltage applied to these FETs is so low that the microwave semiconductor switches of the present invention can cope with a power level of several watts even if the breakdown voltage of FETs is low.

Thus, when a high power microwave is supplied, two FETs are biased so as to provide a low impedance an an RF voltage applied between the drain electrode and the source electrode of the FETs is reduced, so that the FETs are not damaged. Accordingly there is not necessity for any FET to have a high breakdown voltage and hence the production efficiency of switches is greatly enhanced. It is further to be noted that since it is not necessary to reduce any RF voltage applied to the FETs by utilizing a low impedance line having a length equivalent to one half of the wave length, the switches can be made smaller.

It is a third object of the present invention to provide a microwave semiconductor switch having characteristics of higher electric power, lower loss and higher electric isolation.

To accomplish this object, the microwave semiconductor switch of a third embodiment according to the present invention is constructed such that the drain electrodes and the source electrodes of the first FET connected in series to the first and third input/output lines and the second FET connected in parallel with the second input/output line are connected by inductor lines having an identical configuration.

In the microwave semiconductor switch of this embodiment, even if a FET having a wider gate and a low impedance is employed, the inductor line connected between the drain and the source electrodes and the FET capacitance cause a parallel resonance, which enables the microwave semiconductor switch to obtain low loss and high isolation performances in the receiving state of the switch.

Accordingly, it is possible to increase the isolation characteristic in case of a high electric power input in the transmission state, to prevent damage and degradation of the FETs, and to obtain a low loss performance in the receiving state.

BRIEF DESCRIPTION OF THE DRAWINGS

Other objects and advantages of the invention will be apparent from the following description taken in connection with the accompanying drawings wherein.

In these figures, the same reference numerals designate like parts or portions.

DESCRIPTION OF THE PREFERRED EMBODIMENT

Figure 1A:
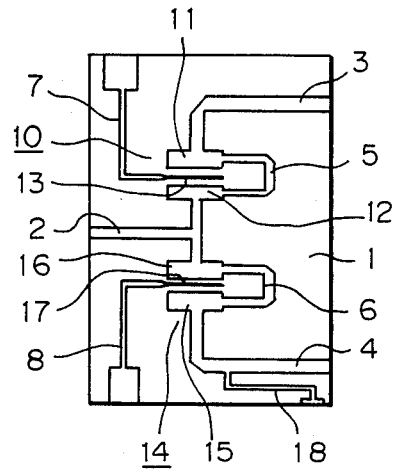
FIGS. 1(a) and 1(b) are plan and side elevation view, respectively, show that the construction of one example of the microwave semiconductor switches according to the prior art.
Figure 1B:
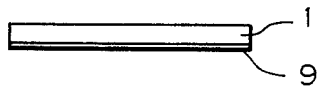
Figure 2:
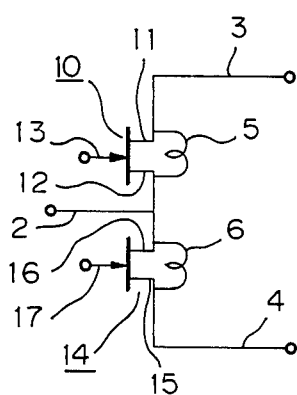
FIG. 2 is an equivalent circuit for the switch shown in FIG. 1.
Figure 3A:
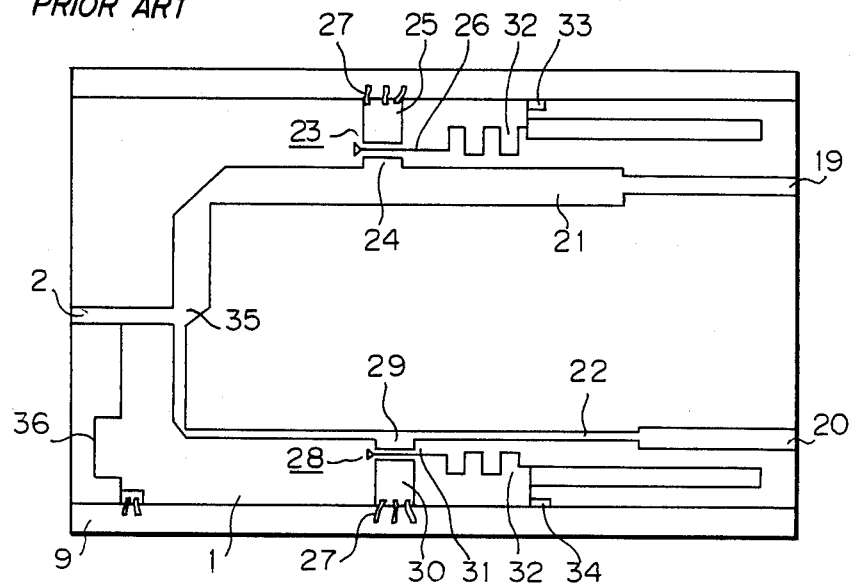
FIGS. 3(a) and 3(b) are plan and side elevation views, resepctively, that show the construction of another example of the microwave semiconductor switches of the prior art.
Figure 3B:
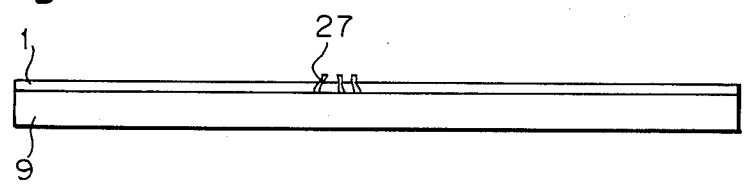
Figure 4:
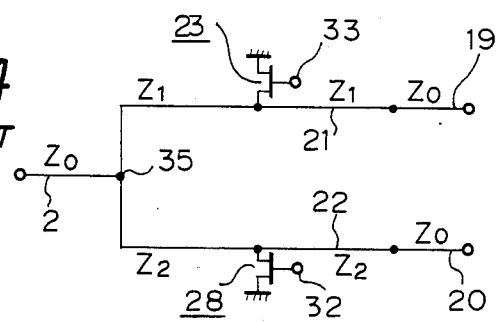
FIG. 4 is an equivalent circuit for the switch shown in FIGS. 3(a) and 3(b).
Figure 5A:
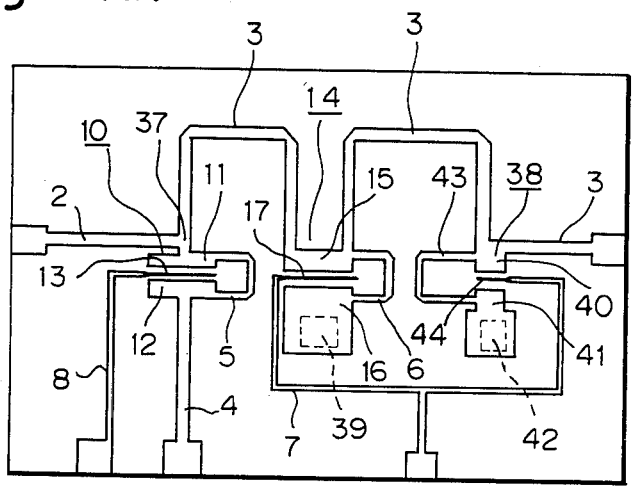
FIGS. 5(a) and 5(b) are plan and side elevation views, respectively, show that the construction of a microwave semiconductor switch of the first embodiment according to the present invention.
Figure 5B:
Figure 6:
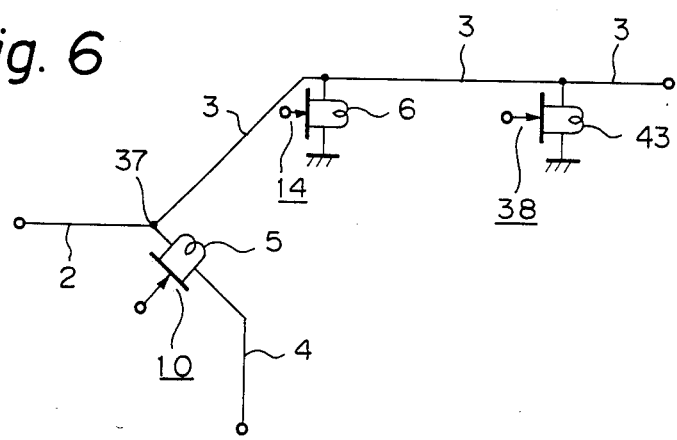
FIG. 6 shows an equivalent circuit for the switch shown in FIG. 5.

Referring first to FIGS. 5(a), 5(b) and 6, the first embodiment of the present invention will now be explained. In these drawings, numerals which are the same as those employed in FIGS. 1(a) and 1(b) designate the same or corresponding portions. Numeral 37 designates the junction point between the first line 2 and the second line 3. Numeral 38 designates the third FET numeral 39 designates the first via-hole, numeral 40 designates the drain electrode of FET 38, numeral 41 designates the source electrode of FET 38, numeral 42 designates the second via-hole, numeral 43 designates the inductor line and numeral 44 designates the gate electrode of FET 38. It is to be noted here that the term "the first point" is employed to designate the junction point between the second line 3 and the drain electrode 15 of the second FET 14 and that the term "the second point" is employed to designate the junction point between the second line 3 and the drain electrode 40 of the third FET 38. The length of the microstrip lines from the junction point 37 to the first point and from the first point to the second point are both selected to be equivalent to one quarter of the wave length (the wave length of the designed center frequency). It is further to be noted that the first line 2 is connected to a microwave antenna, that the second line 3 is connected to a microwave receiver, and that the third line 4 is connected to a microwave transmitter, so that the microwave semiconductor switch may be used for switching of the antenna between the transmission and reception modes. Since an extremely low electrical power is transmitted to the receiver from the antenna, there is no problem even if FETs 10, 14 and 38 are cut off.

Operation of the microwave semiconductor switch shown in FIGS. 5(a) and 5(b) will next be explained referring also to FIG. 6.

When the gate bias voltage having zero V is applied to the gate electrodes 13, 17 and 44, FETs 10, 14 and 38 are all turned ON. The first line 2 is connected to the third line 4 through the drain electrode 11 and the source electrode 12 and the drain electrode 15 is connected to the ground plate 9 through the source electrode 16 and the via-hole 39. The drain electrode 40 is connected to the ground plate 9 through the source electrode 41 and the via-hole 42 and the second line 3 is short-circuited to the ground plate 9 at the first point spaced one quarter of the wavelength from the junction point 37 and at the second point spaced one quarter of the wave length from the first point. Therefore, the impedance as viewed from the junction point 37 to the second line 3 is so high that the microwave power will not propagate along the second line 3 and the first line 2 and the third line 4 are connected by FET 10. If short-circuiting has been perfectly executed by FET 14, short-circuiting by FET 38 is not required. In actuality, however, the leaked power is short-circuited by FET 38 at the second point so that a part of the relatively high transmitted microwave power from the third line 4 cannot propagate along second line 3, thus preventing the occurrence of accidents such as damage of the microwave receiver.

When the negative gate bias voltage $V_{BIAS}$ is applied to the gate electrodes 13, 17 and 44 to make FETs 10, 14 and 38 cut off, the capacitive impedance is provided between the drain electrode and the source electrode of each FET and causes parallel resonance together with the respective inductance lines 5, 6 and 43 to provide a high impedance. Therefore, the microwave supplied from the first line 2 propagates along the second line 3. In this case, the microwave voltage as applied to each FET becomes low because of the low level of the microwave power, and thus the breakdown voltage of the FETs will not cause any problems.

In accordance with the operation explained above, when FETs 10, 14 are turned ON, a relatively large ambunt of current flows therethrough. Accordingly, the width of the gate electrodes of FETs 10, 14 has to be increased. On the other hand, when FET 38 is turned ON, the amount of current which flows therethrough is so small that the gate electrode need not be widened. If the gate width is increased, the parallel resistance shown when FET is cut-off to provide a high impedance due to the parallel resonance with the inductor line is reduced and this causes the loss to be increased. In view of this, the gate width of FET 38 should be made narrower than the gate width of FETs 10 and 14.

In summary, since all the FETs are turned ON when a relatively high power is to be transmitted, the resistance against voltage between the electrodes of FETs will be insignificant.

Figure 7A:
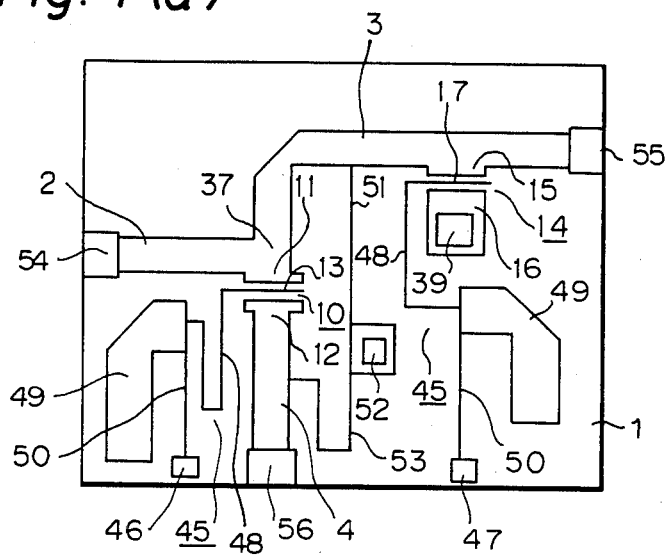
FIGS. 7(a) and 7(b) are plan and side elevation views, respectively, that show the construction of a microwave semiconductor switch of the second embodiment according to the present invention.
Figure 7B:
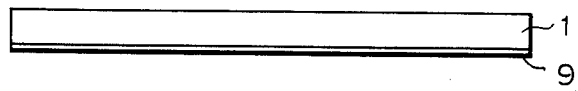
Figure 8:
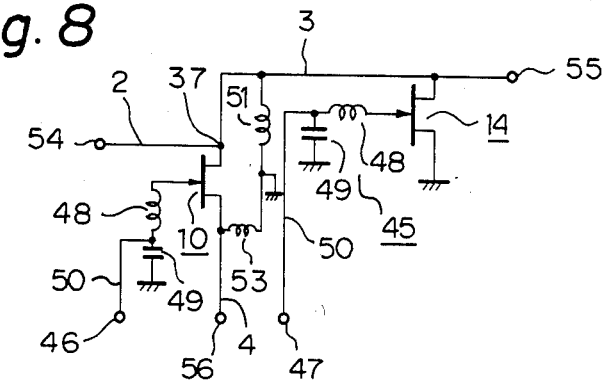
FIG. 8 shows an equivalent circuit for the switch shown in FIGS. 7(a) and 7(b)

Referring to FIGS. 7(a) to 8, the second embodiment of the present invention will now be explained. In FIG. 7(a), the first, second and third input/output lines 2, 3, 4 are, as already explained, formed on semiconductor substrate 1 and form the microstrip lines. In FIG. 7(a), similarly to what is shown in FIG. 5(a), the drain electrode 11 of the first FET 10 is connected to the junction point 37 of the first input/output line 2 and the second input/output line 3 and the source electrode 12 of the first FET 10 is connected to the third input/output line 4. In the mean time, the drain electrode 15 of the second FET 14 is connected to the second input/output line 3 at a position spaced substantially one quarter of the wave length from the junction point 37 and the source electrode 16 of the second FET 14 is grounded through a via-hole 39 to the ground plate 9.

It is to be noted that the bias voltage is applied from the first bias terminal 46 and the second bias terminal 47 through the microstrip line bias circuit 45 to the gate terminal 13 of the first FET 10 and the gate electrode 17 of the second FET 14. The bias circuit 45 comprises a high impedance line 48 having a length corresponding to one quarter of the wave length, a low impedance line 49 also having a length corresponding to one quarter of the wave length, and a connecting line 50 which connects the first bias terminal 46 or the second bias terminal 47 with the junction point of the lines 48 and 50.

In order that the drain electrode 11 of the first FET 10 and the drain electrode 15 of the second FET 14 may be placed at the same grounding potential with respect to the direct current, one end of the first high impedance line 51 having a length corresponding to one quarter of the wave length is connected to the second input/output line 17 and the other end is connected to the via-hole 52. Similarly, in order that the source electrode 12 of the first FET 10 may be placed at the grounding potential with respect to the direct current, one end of the second high impedance line 53 having a length corresponding to one quarter of the wave length is connected to the third input/output line 4 and the other end is connected to the via-hole 52. I the drawing, numerals 54, 55, 56 respectively designate the first, second and third input/output terminals.

The operation will next be explained.

FIG. 8 is an equivalent circuit diagram explaining the operation of the microwave semiconductor switch shown in FIGS. 7(a) and 7(b).

First, consideration is given to the state in which a microwave at a low power level is supplied from the first input/output terminal 54 and propagates to the second input/output terminal 55 with a low loss. For the convenience of explanation, this state is referred to as the receiving state.

In this state, the first and second bias terminals 46, 47 have the negative bias voltage $V_{BIAS}$ which is smaller than the pinch-off voltage Vp of the FETs applied thereto, so the first and second FET 10 and 14 provide a high impedance. Thus, the impedance viewed from the junction point 37 to the third terminal 56 becomes high and the microwave provided from the first input/output terminal 54 propagates to the second input/output line 3 from the first input/output line 2. Furthermore, since the second FET 14 connected in parallel to the second input/output line 3 also provides a high impedance the propagating microwave is not affected.

It is also to be noted that since the spacing between the first FET 10 and the second FET 14 is set to approximately one quarter of the wave length, small reflection is eliminated and low reflection and low loss characteristics may be obtained at the center frequency.

Next, consideration is given to the case where a microwave at a high power level is supplied from the first input/output terminal 54. In this case, the microwave propagates with a low loss to the third input/output terminal 56 and the propagation to the second input/output terminal 55 is cut off.

For convenience of explanation, this state is referred to as th transmitting state.

In this state, the gate bias voltage having zero V equal to the grounding potential is applied to the first and second bias terminals 46, 47 so that the first and second FETs 10 14 provide a low impedance. Since the spacing between the junction point 37 of the first input/output line 2 and the second input/output line 3! and the second FET 14 is determined to be approximately one quarter of the wave length, the impedance as viewed from the junction point 37 to the second terminal 55 provides a high impedance similar to that shown in the fully opened state. On the other hand, since the first FET 10 provides a low impedance, the impedance as viewed from the junction point 36 to the third terminal 55 provides a characteristic impedance (which is equal to a load impedance) of the third input/output line 4. Accordingly, the microwave which is at a high power level as provided from the first input/output terminal 54 is caused to propagate through the first input/output line 2 and the first FET 10 along the third input/output line 4 to the third input/output terminal 56.

As will be apparent from the explanations given above two FETs are biased so as to show a low impedance when a high power microwave is supplied to the semiconductor switch shown in FIGS. 7(a) and 7(b). Accordingly, there is no possibility of application of RF voltage which exceeds the breakdown voltage of the FETs.

It is further to be noted that the RF current which flows through two FETs providing a low impedance increases as the power of microwaves to be provided is increased, but this can be coped with by increasing the gate width of the FETs.

Figure 9A:
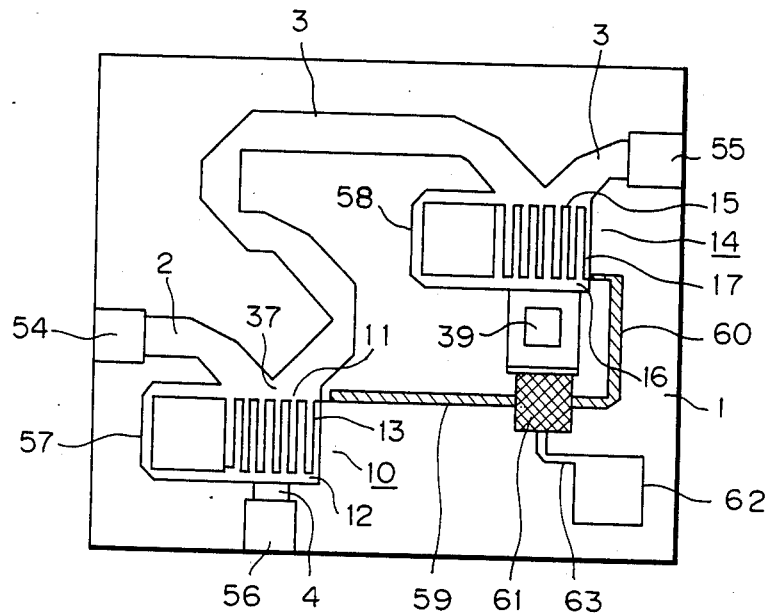
FIGS. 9(a) and 9(b) are plan and side elevation views, respectively, that show the construction of a microwave semiconductor switch of the third embodiment according to the present invention.
Figure 9B:
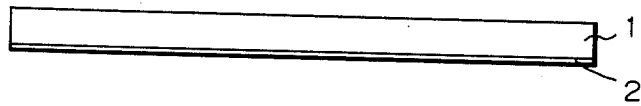

Referring to FIGS. 9(a) and 9(b) a modification of the second embodimant shown in FIGS. 7(a) and 7(b) is illustrated as the third embodiment of the present invention. In this embodiment, the first FET 10 and the second FET 14 have the same configuration and a relatively wide gate electrode. More specifically, the first FET 10 and the second FET 14 are provided with gate electrodes 13 and 17 which have a zigzag configuration in order to increase the gate width. Between the drain electrode 11 and the source electrode 12 of the first FET, the first inductor line 57 is connected. Also between the drain electrode 15 and the source electrode 16 of the second FET, the second inductor line 58 is connected.

The first input/output line 2 and the second input/output line 3 are connected at the junction point 37 at oblique angles relative to the longitudinal direction of the gate electrode 13 so as to form a wedge-shaped cut-out portion. The drain electrode 11 of the first FET 10 is also connected at the same junction point 37. With regard to the second FET 14, on the other hand, a connection is made between the second input/output line 3 and the gate electrode 17 of the second FET 14 having the zigzag configuration at a position spaced approximately about a quarter of the wavelength from the junction point 37 in such a manner that the left and right portions of the second input/output line 3 are connected in this position at opposite oblique angles relative to the longitudinal direction of the gate electrode 17 so as to form a wedge-shaped cut-out portion.

Furthermore, one end of the first bias resistor 59 is connected to the gate electrode 13 and one end of the second bias resistor 60 is connected to the gate electrode 17.

It is to be noted that the resistance value of the bias resistors is set in the order of several kiloohms by selecting the carrier density, thickness and area of the active layer grown on or injected in the semiconductor substrate. The other ends of the first and second bias resistors 59 and 60 are connected to one of the electrodes of the capacitor 61 provided on the semiconductor substrate 1. A bias line 63 is formed to connect one of the electrodes to the common bias terminal 62. The other of the electrodes of the capacitor 61 is connected to the via-hole 39 and grounded.

The function and operation of the third embodiment will now be explained.

In the transmitting state, the common bias terminal 62 is connected to the ground potential (OV).

Since the drain and source electrodes of the first and second FETs 10, 14 are both conductive in terms of D.C. and are at the ground potential in terms of D.C. by virtue of the via-hole 39, a low impedance appears between the drain electrodes and the source electrodes of the FETs. The input power level is assumed to be on the order of 5 W. Since an RF current of approximately 0.5 V is caused to flow the gate electrodes having the zigzag configuration are employed for the purpose of increasing a drain-source current of the FETs and the total gate width is increased to 2.0-3.0 mm. Since this arrangement increases the area of the FETs, the wedge-shaped portions are provided in the second input/output line 3 so as to minimize the distance between the line 3 and the via-hole 39 while connecting the corner defined by the wedge-shaped portions to the drain electrode 15 of the second FET.

It is also to be noted that since the second FET 14 is provided in the direction of the RF current flowing along the second input/output line 3, the RF current is affected significantly by the second FET 14. Thus, since a low impedance is provided between the drain and source electrodes of the second FET 14 and the source electrode is grounded, a large reflection occurs so that a high isolation may be attained. For example, a high isolation higher than 18 dB may be obtained at X band in a FET having the total gate length of about 3.0 mm.

It is further to be noted that the gate rectifying current which is caused to flow when high power is supplied may be restricted to inhibit any increase due to generation of a negative voltage by the first bias resistor 59 and the second bias resistor 60 connected to the gate electrodes thus preventing the FETs from being damaged and degraded.

For example, if an applied power is 5 W, the RF voltage at the gate electrodes will be about 0.55 V. In the type of construction in which the bias resistors are not inserted, if an RF current of 100 μA is caused to flow, the gate voltage will be reduced by about 0.3 V in case a 3 KΩ resistor is employed as the bias resistor and the bias resistor works to reduce the RF current down to a level lower than 100 μA.

Further, compared to a bias circuit constituted by a distributed constant circuit, the bias circuit constituted by resistors 59, 60 and capacitor 61 means that the area occupied can be diminished in size and the chip made smaller.

In the receiving state, a bias voltage less than the pinch-off voltage is applied to the respective gate electrodes 13, 17 of the first and second FETs from the common bias terminal 62 through the first and second bias resistors 59, 60.

In this condition, the impedance between the drain and source electrodes of the FET is capacitive. Since the total gate width is so large, the capacitance between the drain and source electrodes may be large too.

Since the length of the first and second inductance lines 57, 58 connected between the drain and source electrodes of the first and second FETs 10, 14 is so selected as to resonate in parallel with the capacitance between the drain and source electrodes, a high impedance may be provided between the drain and source electrodes.

Accordingly, in the receiving condition, microwaves of a low power level provided from the first input/output terminal 54 may reach the second input/output terminal 55 without being substantially affected by the first FET 10 and then by the second FET 14 and thus a low loss characteristic may be obtained.

In the above-explained embodiment, the input/output lines are disposed to intersect the longitudinal side of the gate electrodes 13, 17 of the first and second FETs at oblique angles. Accordingly, the first and second FETs 10, 14 may be disposed at closer intervals. This arrangement permits one capacitor 61 to be used for common RF grounding and one bias terminal to be used commonly for two FETs, thereby enabling the chip to be made smaller and the external bias wiring circuit to be simplified.

It is to be understood that the above-explained construction may allow the respective configurations of the electrodes of the first and second FETs 10, 14 as well as the first and second inductor lines 57, 58 connected to these FETs to be identical. This therefore permits FETs with identical characteristics to be used as both the FET for serial connection and the FET for parallel connection, so the costs of and time required for developing FETs for switches may be reduced and furthermore the test procedures employed in the course of production may be simplified.

While preferred embodiments of the present invention have been described and illustrated herein, a person skilled in the art will appreciate that changes and modifications may be made therein without departing from the spirit and scope of this invention as defined in the appended claims.

What is claimed is:

1. A microwave semiconductor switch for switching microwave energy of a predetermined bandwidth about a center frequency, said switch comprising, a semiconductor substrate having microstrip lines and field effect transistors formed thereon on one side and a ground plane on another side, including:

first, second and third microstrip lines, each of said first, second and third microstrip lines having a first and a second end, the first ends of said first, second and third microstrip lines being connected together at a common junction point;

a first field effect transistor having a source, a drain and a gate, said first field effect transistor gate having a first gate width, and said first field effect transistor source and drain being connected in series between said common junction point and said second end of said third microstrip line;

a second field effect transistor having a source, a drain and a gate, said seocnd field effect transistor gate having a second gate width, and said second field effect transistor source and drain being connected in series between said second microstrip line and said ground plane at a first position on said second microstrip line spaced substantially one quarter wavelength of said center frequency from said common junction point;

a third field effect transistor having a source, a drain and a gate, said third field effect transistor gate having a third gate width narrower than said first and second gate widths, and said third field effect transistor source and drain being connected between said second microstrip line and said ground plane at a second position on said second microstrip line spaced substantially one half wavelength of said center frequency from said common junction; and circuit means connected to the gates of said first, second and third field effect transistors for simultaneously turning said first, second and third field effect transistors on and off, whereby a microwave transmission path is switched between said first microstrip line and said second and third microstrip lines.

2. A microwave switch as claimed in claim 1 wherein a first microstrip line haivng a first inductive impedance at said center frequency is formed on said substrate interconnecting said drain and said source of said first field effect transistor and a second microstrip line having a second inductive impedance at said center frequency is formed on said substrate interconnecting and said drain and said source of said second field effect transistor, and wherein bias voltage lines are formed on said substrate to supply a bias voltage to said gate of said first field effect transistor and to said gate of said second field effect transistor.

3. A microwave switch as claimed in claim 2 wherein said first inductive impedance has a value which, together with a first capacitance of said first field effect transistor, when turned off, forms a resonant circuit having a resonant frequency at said center frequency.

4. A microwave switch as claimed in claim 2 wherein said second inductive impedance has a value which, together with a second capactiance of said second field effect transistor, when turned off, forms a resonant circuit having a resonoant frequency at said center frequency.

5. A microwave semiconductor switch for switching a microwave transmission path carrying microwave energy of a predetermined bandwidth about a center frequency between a first transmission path capable of handing a predetermined microwave power level and a second transmission path capable of handling a microwave power level substantially less than said predetermined power level handled by said first transmission path, said switch comprising, a semiconductor substrate having microstrip lines and field effect transistors formed thereon on one side and a ground plane on another side, including:

first, second and third microstrip lines, each of said first, second and third microstrip lines having a first and a second end, the first ends of said first, second and third microstrip lines being connected together at a common junction point;

a first field effect transistor having a source, a drain and a gate, said first field effect transistor source and drain being connected in series between said common junction point and said second end of said third microstrip line in order to form said first microwave transmission path, said first and said second microstrip lines forming said second microwave transmission path; a first pair of bias lines each having a length equal to one quarter wavelength of said center frequency, one of said first pair of bias lines connecting said drain of said first field effect transistor to said ground plane and the other of said first pair of bias lines connecting said source of said first field effect transistor to said ground plane so that said drain and source of said first field effect transistor are at the same D.C. potential;

a second bias line having a length equal to one quarter wavelength of said center frequency connecting said gate of said first field effect transistor to a first source of bias voltage;

a second field effect transistor having a source, a drain and a gate, said second field effect transistor source and drain being connected in series between said second microstrip line and said ground plane at a first position on said second microstrip line spaced substantially one quarter wavelength of said center frequency from said common junction point;

a third bias line having a length equal to one quarter wavelength of said center frequency connecting said gate of said second field effect transistor to a second source of bias voltage whereby said first and said second field effect transistors are controlled simultaneously to turn on or off in order to switch said microwave transmission paths.

6. A microwave semiconductor switch for switching a microwave transmission path carrying microwave energy of a predetermined bandwidth about a center frequency between a first transmission path and a second transmission path, said switch comprising, a semiconductor substrate having microstrip lines and field effect transistors formed thereon on one side and a ground plane of another side, including:

first and second microstrip lines, said second microstrip line having a length equal to substantially a quarter wavelength of said center frequency;

a first field effect transistor having a source, a drain and a meandering gate with a longitudinal direction, said first microstrip line being connected to said first field effect transistor so that microwave energy is transmitted between said first microstrip line and said first field effect transistor in a direction oblique to said longitudinal direction of said first field effect transistor gate, said second microstrip line being connected to said first microstrip line and to said first field effect transistor so that microwave energy is transmitted between said second microstrip line and said first field effect transistor in a direction oblique to said longitudinal direction of said first field effect transistor gate;

a third microstrip line connected to said first field effect transistor so that said first field effect transistor is in series with said first microstrip line and said second microstrip line and said third microstrip line to form said first microwave energy transmission path;

a second field effect transistor having a source, a drain and a meandering gate having a longitudinal direction, said second microstrip line being connected to said second field effect transistor so that microwave energy is transmitted between said second microstrip line and said second field effect transistor in a direction oblique to said longitudinal direction of said second field effect transistor gate;

a fourth microstrip line being connected to said second microstrip line and to said second field effect transistor so that microwave energy is transmitted between said fourth microstrip line and said second field efect transistor in a direction oblique to said longitudinal direction of said second field effect transistor gate, said second microstrip line and said fourth microstrip lines forming said second microwave transmission path; and a fifth microstrip line connected to said second field effect transistor and to said ground plane so that said second field effect transistor is in series with said second microstrip line and said ground plane.

7. A microwave switch as claimed in claim 6 wherein said first field effect transistor drain has a shape identical to said second field effect transistor drain, said first field effect transistor source has a shape identical to said second field effect transistor source, and said first field effect transistor gate has a shape identical to said second field effect transistor gate.

8. A microwave switch as claimed in claim 7, further comprising a capacitor having a first and second electrode and first and second bias resistors, each having first and second ends, said first end of said first bias resistor being connected to said first field effect transistor gate, said first end of said second bias resistor being oonnected to said second field effect transistor gate, said second ends of said first and second bias resistors being connected to a source of bias potential, said capacitor having said first electrode connected to said bias terminal and said second electrode connected to said ground plane.

9. A microwave switch as claimed in claim 8 wherein said first and second bias resisstors and said capacitor are formed on said substrate.

* * * * *